United States Patent
Modawar et al.

(10) Patent No.: US 8,945,794 B2
(45) Date of Patent: Feb. 3, 2015

(54) PROCESS FOR FORMING SILVER FILMS ON SILICON

(76) Inventors: Faris Modawar, Woburn, MA (US); Jeff Miller, Woburn, MA (US); Mike Jura, Woburn, MA (US); Brian Murphy, Woburn, MA (US); Marcie Black, Woburn, MA (US); Brent A. Buchine, Watertown, MA (US)

( * ) Notice: Subject to any disclaimer, the term of this patent is extended or adjusted under 35 U.S.C. 154(b) by 145 days.

(21) Appl. No.: 13/373,484

(22) Filed: Nov. 14, 2011

(65) Prior Publication Data

US 2012/0156585 A1 Jun. 21, 2012

Related U.S. Application Data

(60) Provisional application No. 61/413,252, filed on Nov. 12, 2010.

(51) Int. Cl.
| | |
|---|---|
| *H01M 4/36* | (2006.01) |
| *H01B 13/00* | (2006.01) |
| *H01L 31/00* | (2006.01) |
| *H01L 21/308* | (2006.01) |
| *H01L 21/306* | (2006.01) |
| *B82Y 10/00* | (2011.01) |

(52) U.S. Cl.
CPC ...... *H01L 21/3086* (2013.01); *H01L 21/30604* (2013.01); *B82Y 10/00* (2013.01)
USPC .............................. 429/532; 216/13; 136/261

(58) Field of Classification Search
USPC .................... 429/479, 532, 524, 518
See application file for complete search history.

(56) References Cited

U.S. PATENT DOCUMENTS

| | | |
|---|---|---|
| 6,248,674 B1 | 6/2001 | Kamins et al. |
| 6,635,184 B1 | 10/2003 | Cohen et al. |
| 2006/0207647 A1 | 9/2006 | Tsakalakos et al. |
| 2007/0107103 A1 | 5/2007 | Kempa et al. |
| 2007/0190542 A1 | 8/2007 | Ling et al. |
| 2007/0278476 A1 | 12/2007 | Black |
| 2008/0169017 A1 | 7/2008 | Korevaar et al. |
| 2009/0256134 A1* | 10/2009 | Buchine et al. ............... 257/9 |
| 2010/0092888 A1 | 4/2010 | Buchine et al. |
| 2010/0233585 A1 | 9/2010 | Niu et al. |
| 2011/0186117 A1* | 8/2011 | Kumar et al. ............ 136/256 |

OTHER PUBLICATIONS

H. Asoh et al., Electrochemical Communications, vol. 9, p. 535-539 (2007).
L. Boarino et al., Physica Status Solidi A, vol. 206, pp. 1250-1254 (2009).
C.K. Chan et al., Nature Nanotechnology, vol. 3, pp. 31-35 (2008).
Y. Cui et al., Applied Physics Letters, vol. 78. pp. 2214-2216 (2001).
H. Fang et al., Nanotechnology, vol. 17, pp. 3768-3774 (2006).
C. Gao et al., Microelectronic Engineering, vol. 87, pp. 927-930 (2010).
Z. Huang et al., Advanced Functional Materials, vol. 19, p. 744 (2007).

(Continued)

*Primary Examiner* — Muhammad Siddiquee

(57) ABSTRACT

A process is provided for etching a silicon-containing substrate. In the process, the surface of the substrate is cleaned. A film of alumina is deposited on the cleaned substrate surface. A silver film is deposited above the film of alumina. An etchant comprising HF is contacted with the silver film.

14 Claims, 9 Drawing Sheets

(56) References Cited

OTHER PUBLICATIONS

Z. Huang et al., Nano Letters, vol. 9, pp. 2519-2525 (2009).
M.D. Kelzenberg et al., Nano Letters, vol. 8, pp. 710-714 (2008).
X. Li and P. W. Bohn, Applied Physics Letters, vol. 77, p. 2572-2574 (2000).
A. Luque and A. Martí, Physical Review Letters, vol. 78, pp. 5014-5017 (1997).
K. Peng et al., Advanced Materials, vol. 16, pp. 73-76 (2004).
K. Peng et al., Advanced Materials, vol. 16, p. 387 (2006).
Peng et al., Applied Physics Letters, vol. 90, 163123 (2007).
T. Qiu et al., Applied Physics Letters, vol. 84, 3867 (2004).
Q. Shao and A.A. Balandin, Applied Physics Letters, vol. 91, 163503 (2007).
H.W. Shim et al., Nanotechnology, vol. 20, 025704 (2009).
Tsakalakos et al., Applied Physics Letters, vol. 91, 233117 (2007).
Y. Yang et al., Applied Surface Science, vol. 254, p. 3061-3066 (2008).

* cited by examiner

PROCESS FOR FORMING SILVER FILMS ON SILICON

CROSS-REFERENCE TO RELATED APPLICATIONS

This application claims priority to U.S. Provisional Patent Application No. 61/413,252, filed Nov. 12, 2010, which is incorporated by reference herein.

BACKGROUND OF THE INVENTION

The ability to structure and pattern silicon is important for many applications. There has been particular interest in patterning silicon to make nanostructures. Relevant information regarding silicon fabrication processes known to those of skill in the art can be found, for example, in Sami Franssila, *Introduction to Microfabrication* (John Wiley & Sons, 2004), and the references cited there. Information regarding common techniques for the deposition of metals on silicon is found in Ronald A. Powell & Stephen Rossnagel, *PDV for Microelectronics: Sputter Deposition Applied to Semiconductor Manufacturing* (Academic Press 1999).

Semiconductor nanowires have become the focal point of research over the last decade due to their interesting physical, chemical and biological properties. There is particular interest surrounding silicon nanowires, as silicon is one of the most abundant materials in the earth's crust and has become a cornerstone for many of the electronic, optoelectronic, electro-chemical and electro-mechanical devices upon which designs are based.

Silver-assisted etching of silicon has the potential to produce nanowires and other useful nanostructures. The present assignee has described ways of carrying out such etching, for example, in U.S. Published Patent Applications Nos. 2009/256134 and 2010/92888. In certain processes, nanoparticles are dispersed over the surface of a silicon-containing substrate, silver is deposited on top of the nanoparticles, the result is placed in an etchant containing HF. Nanowires are formed where the nanoparticles were placed.

In silver assisted etching processes, it has been found that the quality of the silver film influences the quality of the resulting nanostructures. It has also been found that residual silver left after the etching has potential uses. There is therefore a need for methods which can produce better silver films on silicon substrates.

SUMMARY OF THE INVENTION

A process is provided for etching a silicon-containing substrate. In the process, the surface of the substrate is cleaned. A film of alumina is deposited on the cleaned substrate surface. A silver film is deposited above the film of alumina. An etchant comprising HF is contacted with the silver film.

DETAILED DESCRIPTION OF THE INVENTION

Figure 1:
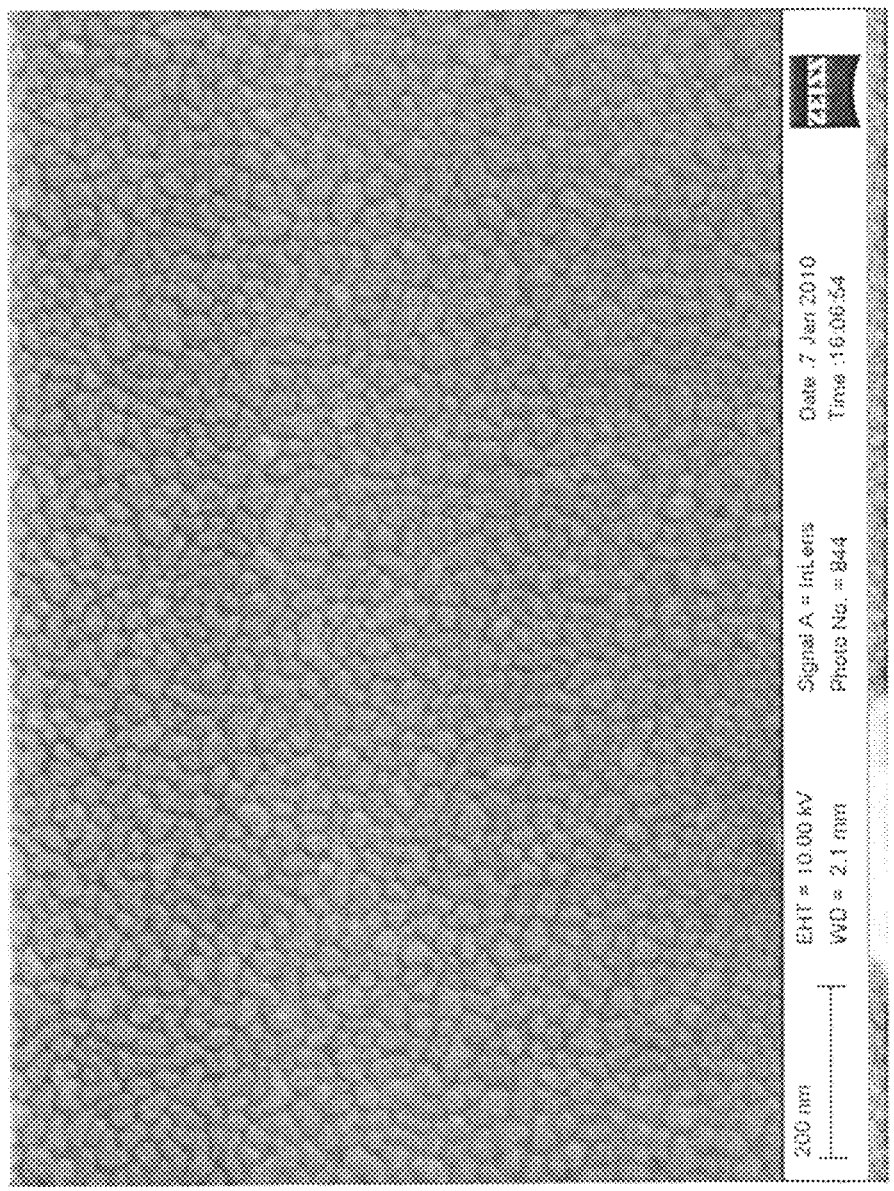
FIG. 1 is a micrograph depicting the results of an experiment in which 6 nm of silver were deposited on top of 100 nm of alumina, which was sputtered on top of a clean silicon wafer.
Figure 2:
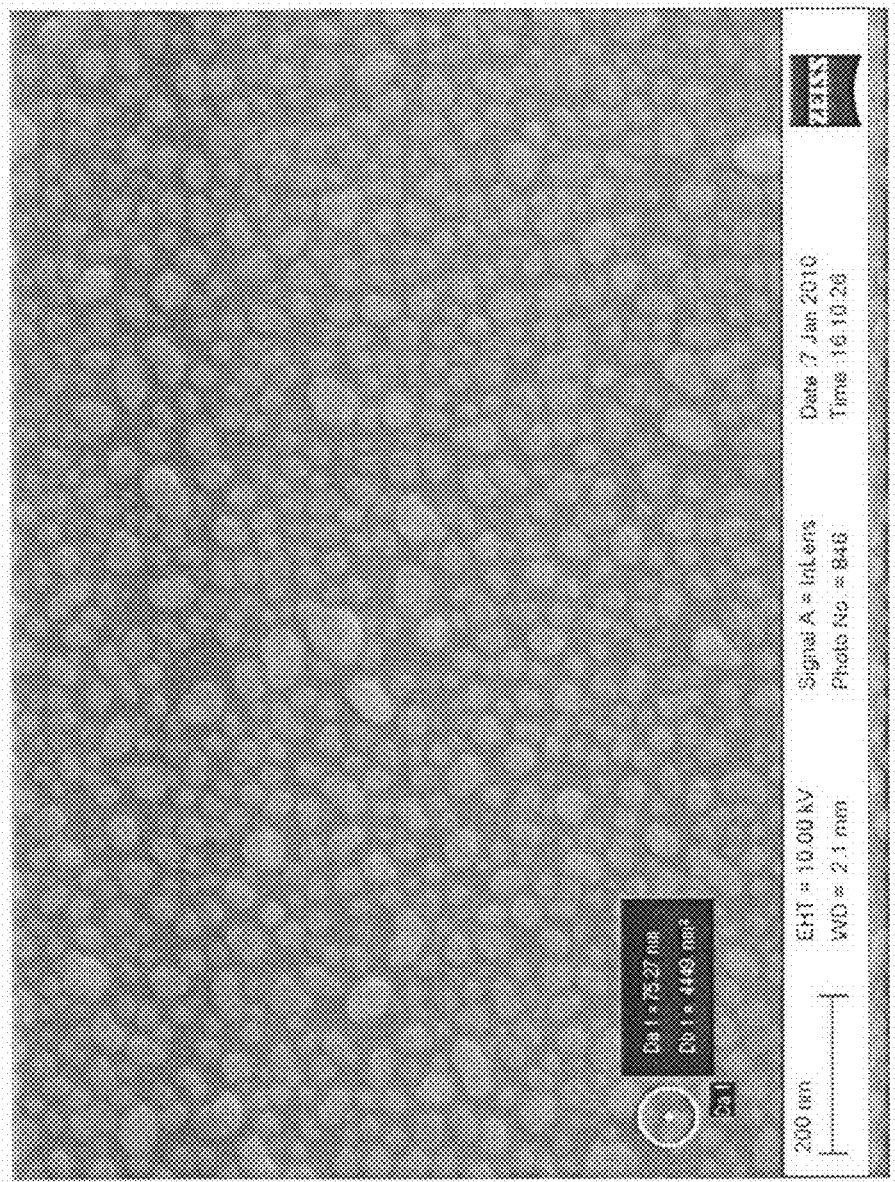
FIG. 2 is a micrograph depicting the results of an experiment in which 6 nm of silver were deposited on top a clean silicon wafer.
Figure 3:
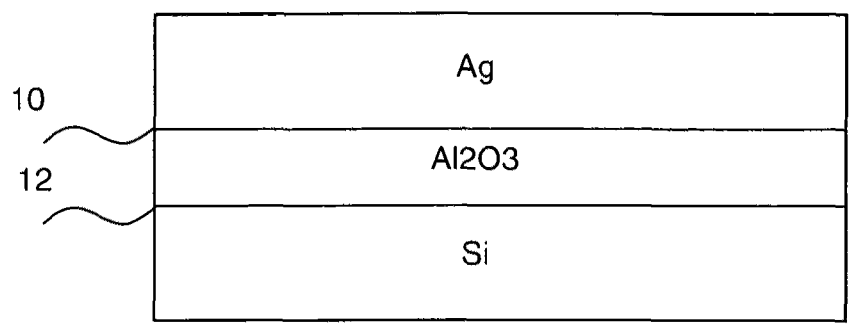
FIG. 3 schematically depicts a silver film atop an alumina film atop silicon.
Figure 4:
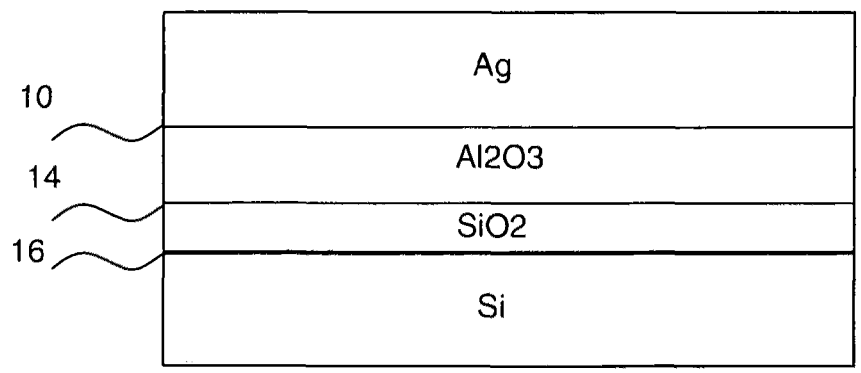
FIG. 4 schematically depicts a silver film atop an alumina film atop silicon dioxide atop silicon.

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Exemplary Process

An exemplary process utilizes sputtering of alumina onto a silicon substrate. For this example, a 0.001 ohm-cm boron doped silicon wafer was used. Prior to sputtering alumina, the silicon surface is prepared by a pre-clean. The substrate is pre-cleaned by sonicating for three minutes each in acetone, methanol, and then isopropyl alcohol. The substrate is then rinsed in a dump-tank of flowing deionized water (DI) for 3 minutes to remove any residue remaining from the solvent clean. Next, the samples are placed in a solution of piranha which is 3 parts sulfuric acid and 1 part hydrogen peroxide. The piranha is left at the temperature reached by the exothermic reaction. The sample is rinsed again in the DI dump-tank for 5 minutes.

Next, 300 nm polystyrene spheres are deposited. (Other sizes can also be employed, for example 100 nm.) The spheres are diluted to a concentration of 1% and with a sulfinated surfactant. The spheres were purchased from Duke Scientific Corporation. The spheres are mixed with a blend of 3 parts 1% polystyrene spheres to 1 part methanol triton-X. These are then spun onto the substrate at 500 RPM spread cycle for 5 seconds followed by a ramp to 1500 RPM for 40 seconds. The polystyrene spheres form a single monolayer on the surface.

A pulsated $O_2$ plasma is used to reduce the size and spacing in the polystyrene spheres inside an $O_2$ plasma resist stripper prior to inserting the sample into the metal deposition tool (30 W, 200 mTorr). The sample heats up during the plasma clean, which can change the properties (or melt) the polystyrene making it difficult to continue the shrinking process. To resolve this, the polystyrene is etched using short 1 minute intervals, removing the substrate from the tool and allowing it to cool to room temperature prior to the next 1 minute etch.

Next the samples are prepared with an argon in situ sputtering clean. The clean is at 2.5 Watt, 25 mTorr for 5 minutes. This is followed by a 40 nm alumina deposition. The sputter is conducted at 35 W, 4 mTorr, at a rate of 1.5 A/sec. with a base pressure of $10^{-6}$ Torr. Next, 24 nm of silver film is deposited at a deposition rate of 0.1 A/s, 2.5 W, at 2 mTorr.

The samples are submerged into a 4.5% hydrofluoric acid (HF) solution with oxygen bubbled through the solution. As a preseasoning, $O_2$ gas is flowed into the bath at a vigorous bubbling for a period of 10 minutes.

Enhanced metal etching was conducted at the silver/alumina interface and then once the alumina was completely etched at the silver/silicon interface. The nanoparticles acted as a barrier by which to mask and define the nanostructure. The dimensions of the nanoparticles, which are selected per the desired application, influence the dimensions and the shape of the resulting one-dimensional nanostructure.

At the completion of the etch, the samples are removed and put into a dump-tank of DI water and blown dry with $N_2$. At this point the remaining Ag on the surface can be removed with a silver etchant, for example the etchant supplied by Transene Corporation.

Results Obtained

Figure 5:
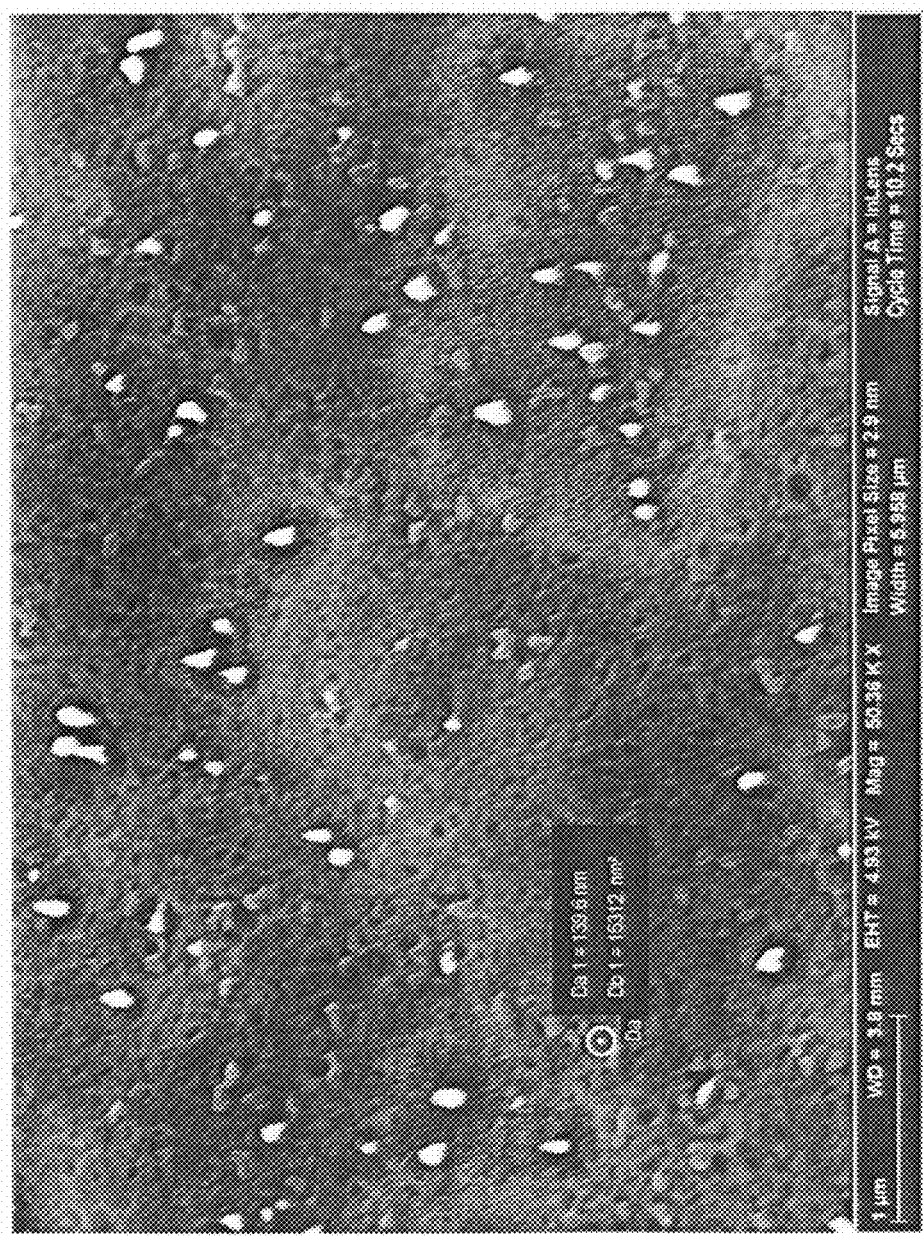
FIG. 5 is a micrograph depicting silicon nanowires formed by depositing a 24 nm Ag film on a <100> silicon wafer with a thin native oxide, and then etching the silicon using the process described below.
Figure 6:
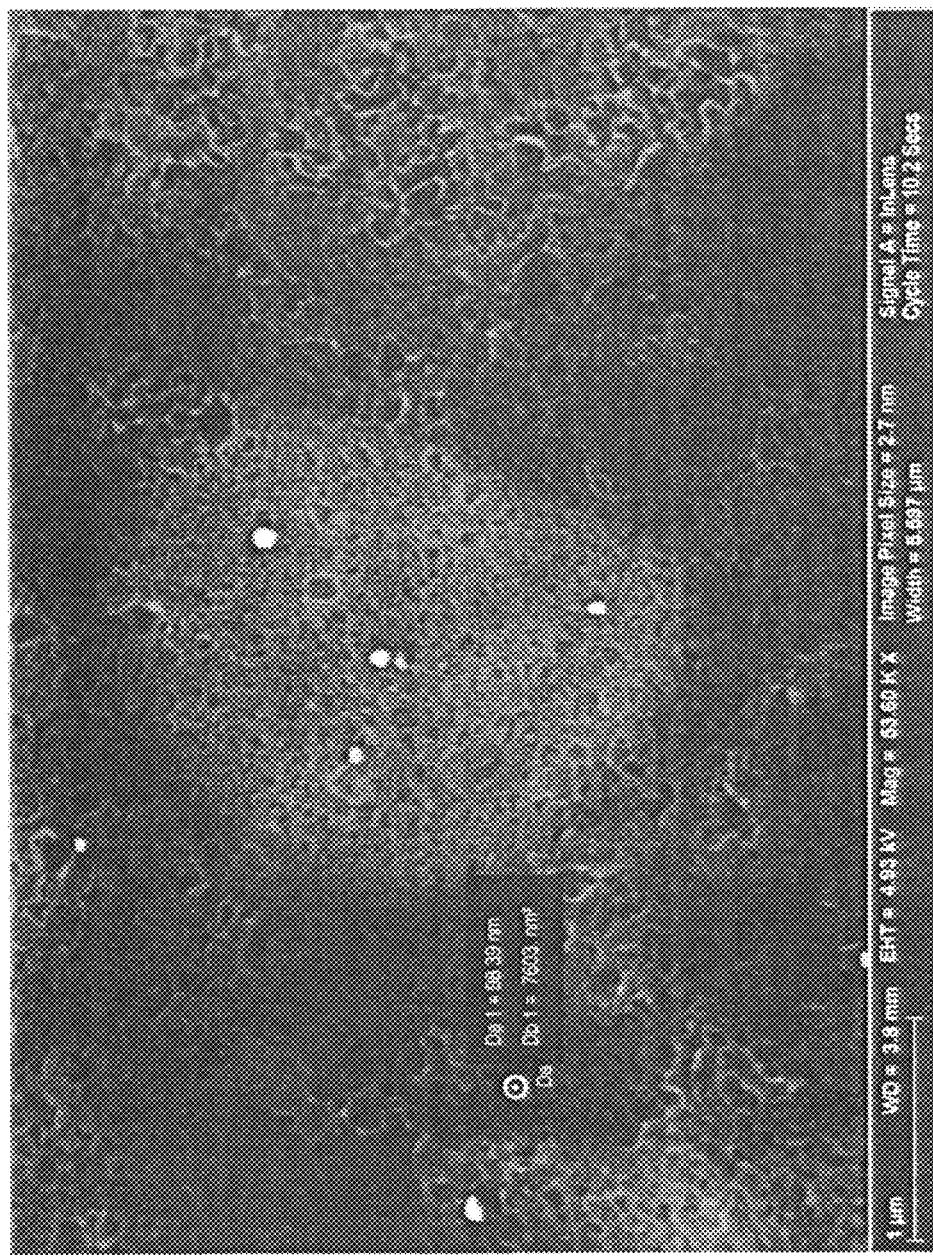
FIG. 6 is a micrograph depicting silicon nanowires formed by depositing 100 nm of alumina and then depositing a 24 nm Ag film on a <100> silicon wafer with a thin native oxide, and then etching the silicon using the process described below.
Figure 7:
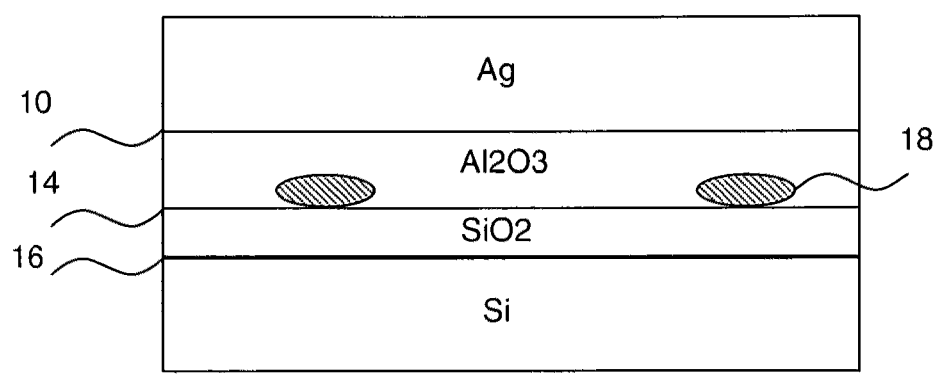
FIG. 7 schematically depicts nanoparticles in the alumina layer of a set of films like FIG. 4.
Figure 8:
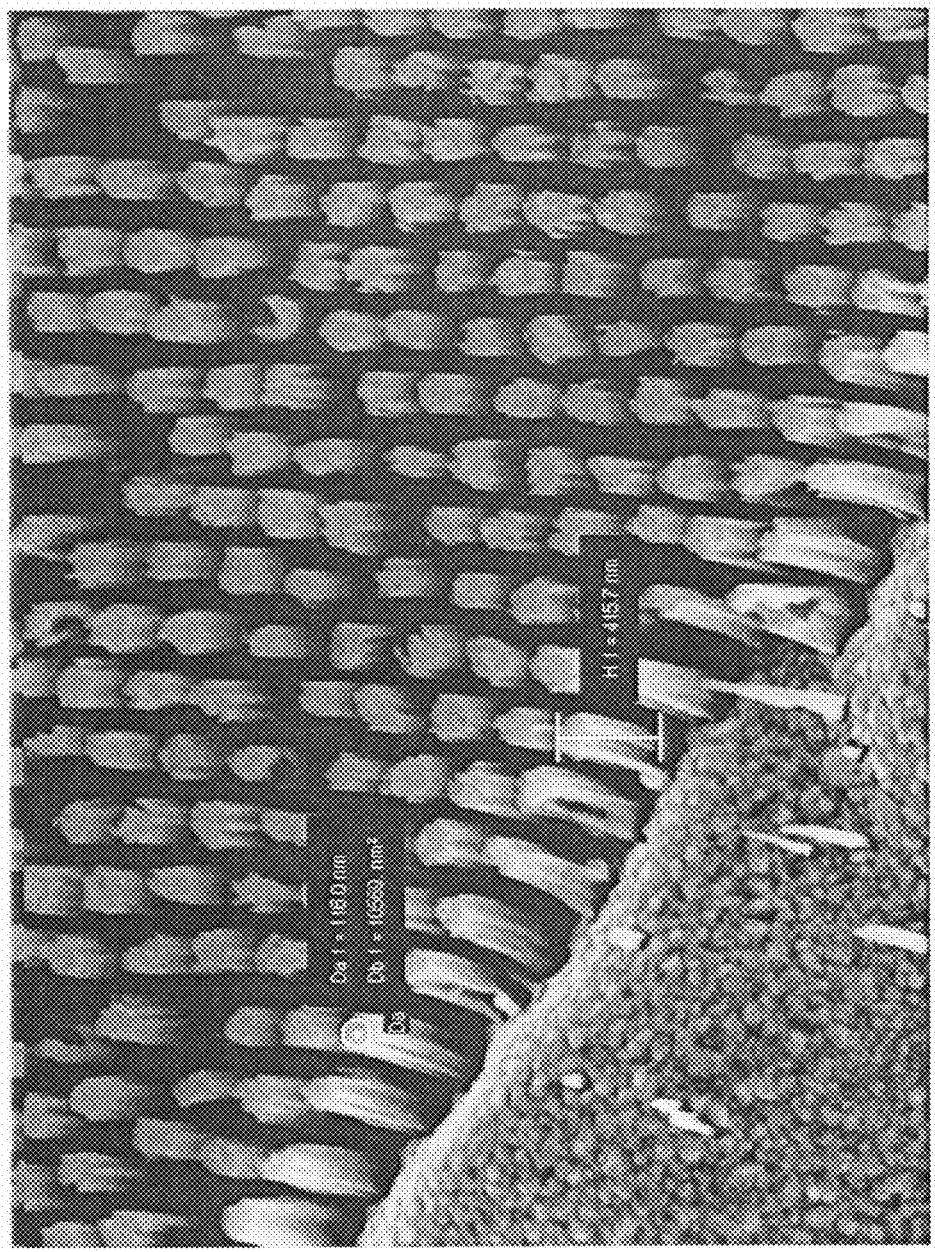
FIG. 8 is a micrograph depicting the result of passing a sample like that depicted in FIG. 6 through an etching process designed to form silicon nanowires.

The results obtained by processes of the invention are shown in FIGS. 6 and 8. Compared to FIG. 5, in which no alumina was deposited, it is seen that after etching in FIG. 6 there are very few undesired nanowires. The 3-D appearance of the undesired nanowires is readily seen in FIG. 8, a scanning electron micrograph. It may be seen that they are scattered irregularly and much thinner than the desired nanowires.

Figures of Merit

A figure of merit for the deposited silicon film is the number of unintended nanowires that result from the etching process. This number may be, for example, less than about 20 per $\mu m^2$, less than about 10 per $\mu m^2$, or less than about 5 per $\mu m^2$. An unintended nanowire will generally be smaller and thinner than an intended nanowire (e.g., one which results from a nanoparticle such as the polystyrene spheres in the exemplary process). Unintended nanowires may be counted visually on a scanning electron micrograph of the surface.

It is believed that unintended nanowires result from imperfections in the silver. These imperfections comprise two categories: silver "bridges," i.e., places where the silver film is separated over a small area from the underlying substrate, and gaps in the silver surface.

Without wishing to be bound by theory, it is believed that normally the silver prefers to deposit onto itself rather than on silicon. At first as the silver is deposited, the silver particles land on the silicon. As the process continues, the silver prefers to deposit onto other silver particles rather than the silicon. This either forms a hole in the silver film, or the hole is bridged over with silver forming a nano-silver bridge. In the case of bridging, looking at the silicon substrate from the top reveals a continuous film of silver, but underneath the top layer, there exist nano-sized areas where the silver is not in contact with the silicon. Since these areas are not in contact with the silicon, they lead to unintentional nanowires.

In order to achieve silver-enhanced etching, the material that is used to improve the quality of the silver film must also be etched by this process. It has surprisingly been found that sputtered alumina fits this criterion and can be etched.

A further figure of merit is the achievable diameter of the intended nanowires. Using processes of the invention it is possible to achieve nanowire diameters which are on average below about 150 nm, below about 125 nm, below about 100 nm, below about 70 nm, or below about 50 nm. Small nanowires are important in certain applications, such as where the small size changes the band structure of the silicon or where a large surface area to volume ratio is needed. It may be desired, for example, that a majority, or about 75%, or about 90%, or about 95% of the nanowires have diameters less than a selected dimension or within a selected diameter range distribution, such as those indicated above.

A third figure of merit is the diameter distribution. Since the unintended wires tend to be small in diameter (e.g., <100 nm or <50 nm), when targeting arrays of nanowires with larger diameters, the unintentional wires lead to a bimodal distribution of wire diameters encompassing smaller wires. Processes of the present invention can decrease the number of nanowires outside a desired diameter range to less than about 10%, less than about 5%, or less than about 1% of the wire diameter distribution.

Figure 9:
FIG. 9 is a micrograph depicting the result of passing a sample with a 110 nm film of silver through an etching process designed to form silicon nanowires.
Figure 10:
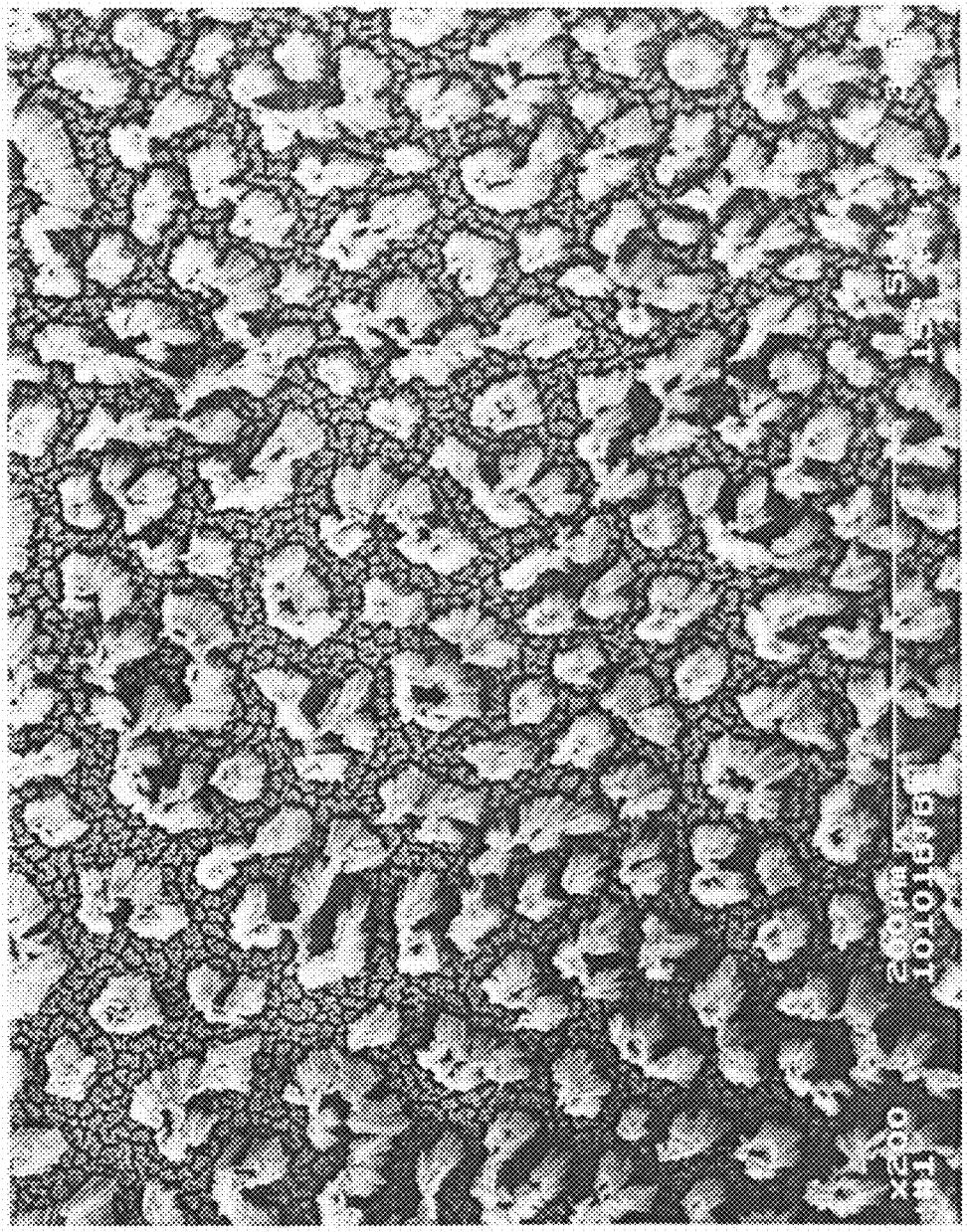
FIG. 10 is a micrograph depicting the result of passing a sample with a 35 nm film of alumina and a 110 nm film of silver through an etching process designed to form silicon nanowires.

A further figure of merit is the thickness of the silver that can be reliably etched. It has been found that the use of alumina deposition first under the silver allows substrates with a greater thickness of silver to be etched reliably, i.e., with the etching resulting in the formation of regular arrays of nanowires, without there being unintended spots where no nanowires are formed, for example because the silver detaches itself from the silicon substrate in the course of etching or because the silver beads up forming regions with very thick silver and regions without silver. FIG. 9 shows an SEM image of a nanowire array formed with a 110 nm film of silver deposited directly onto a silicon surface and then immersed into a solution of 3% hydrogen peroxide and 16.3% HF mixed in a volume ratio of 1:1. The sample was very inhomogenous with some areas forming nanowires and other areas not etching. FIG. 10 shows an SEM image of a nanowire array formed with the sample process, but with a 35 nm film of alumina deposited before the 110 nm film of silver. The alumina resulted in a more uniform layer of silver, which resulted in a more uniform array of nanowires.

A further figure of merit is the uniformity of the silver film achieved, for example as measured by its variability in thickness. The thickness of the silver film may for example have a standard deviation of no more than 50%, no more than 25%, or no more than 15% or 10%.

Nanoparticles with multiple diameters can also be used, leading to an array of wires with multiple diameter ranges.

Applications

Processes of the invention may be applied to structuring silicon for optoelectronic devices (see reference (i)). They may be employed in devices that utilize the photoelectric or photovoltaic effect, for example solar cells (see, e.g., references (j) and (k)), photodetectors, photodiodes (see reference (a)), phototransistors, photomultipliers and integrated optical circuits. Silicon nanowire arrays or individual nanowires fabricated via this process can be utilized within each of these applications. Nanowires can help emissive optoelectronic devices in several ways: they can help increase the percentage of light that exits a material, or modify optical properties by quantum or surface effects. For absorbing optoelectronic devices, the low reflection of silicon nanowires allows more light to be absorbed in the material. One design of a solar cell includes a silicon nanowire array on top of a silicon wafer with a p-n junction in the bulk. The nanowires both reduce the reflection of the solar cell and increase the absorption of the silicon, leading to an increase in efficiency of the device. In addition, to the p-n junction, nanowire array, and bulk silicon, a front and a back contact are required to electrically connect to the device.

Processes of the invention may be employed to produce devices made out of or comprising polycrystalline silicon. The invention encompasses processes which can be used with any crystalline orientation of silicon. Such processes can be used to texture the surface of and/or form nanowires in polysilicon. Polysilicon is a cheaper material than crystalline silicon, but it is typically more difficult to texture and structure than single crystal silicon due to the random orientation of the grains. Texturing polysilicon is useful to reduce the reflection in polycrystalline (multicrystalline, nanocrystalline, or microcrystalline) silicon solar cells. Reducing the reflection of solar cells can increase the cells' quantum efficiency, and hence decrease the cost of photovoltaic power. The processes of the invention can likewise be used to form nanowires in amorphous silicon.

Arrays of silicon nanowires can be used in applications where the silicon will be subjected to stress or strain where the nanostructure is able to absorb and relax this stress or strain. For example, nanowires can act as an interfacial layer between bulk silicon and another material grown on top which is not lattice-matched to it. Controlling the diameter of the nanowire arrays, and ensuring that most of the nanowires have approximately the same chosen diameter, allows the engineer to optimize the nanowire array so that the best quality material can be grown on top of the nanowire array.

Processes of the invention are also applicable to lithium ion battery technology. Silicon has been seen as a desirable candidate for the anode material in lithium ion batteries due to its low discharge potential and high charge capacity. Its application in the past has been limited due to the large change in volume associated with ion insertion and ion extraction. The large amounts of stress and strain that builds in the silicon results in degradation of the silicon layer resulting in a very short performance lifetime. Nanowires have been pursued due to their ability to withstand these stress and strains (see reference (1)). The ability to form well ordered and aligned nanostructures with a great deal of control over the resulting diameter and void spacing between them provided by processes of the invention would be advantageous in making a lithium ion battery anode. In addition, the fact that porous silicon (nanopores or micropores) can also be fabricated via processes of this invention would enable the fabrication of another anode geometry capable of withstanding the stresses and strains of ion insertion/extraction for lithium ion battery applications.

Processes of the invention may be used to create nanostructures which make silicon into an intermediate band photovoltaic material (IBPV). (See reference (n).) Silicon has an excellent band structure for IBPV, provided that the strength of particular electronic transitions can be enhanced. One way to do this is to form a dense array of silicon nanowires with specific control over the wire diameter, doping and crystallographic orientation, as described in reference (i). Processes of the invention may be used for manufacturing such nanowire arrays. A figure of merit for IBPV's is the percentage of transitions which involve the intermediate band. Such a percentage could be, for example, at least about 5%, at least about 10%, at least about 15%, or at least about 20%, where the solar radiation conforms to an American Society for Testing and Materials air mass 1.5 37-degree latitude reference spectrum. The percentage of transitions from the valence band to the intermediate band or from the intermediate band to the conduction band are alternative figures of merit. Such a percentage could be, for example, at least about 5%, at least about 10%, at least about 15%, or at least about 20%, under the same normalized solar radiation.

Arrays of silicon nanowires can also be used for fuel cells as a catalyst support structure. Current systems utilize a powder catalyst, sacrificing significant surface area in the process. For example, platinum is often used in the fuel cell, but is very expensive so that one would wish to use less of it if one could do so without affecting cell performance. Silicon nanowires fabricated with the processes of the invention could be cheaply produced and then a thin film of platinum could be deposited on top of the nanowire array. The coated silicon nanowires would have a large surface area of platinum exposed, without using much volume of platinum. In other words, the silicon nanowires would allow a suitable support structure while simultaneously allowing the catalyst material to have a direct electrical contact.

Processes of the invention may be used to create arrays of nanowires for improving friction characteristics of a surface. Nanowires exhibit strong adhesion and high Young's Moduli (see reference (s)). Surfaces with nanowires manufactured with the processes of the invention may be used in actuators, transducers, and brake systems with improved tribological performance.

Arrays of nanowires may be used as gas phase particle sensors. The high surface area characteristics of nanowires may help with high sensitivity gas sensors (see reference (t)). The following references are potentially of interest in relation to this application: (a) K. Peng, Z. Huang, and J. Zhu, *Adv. Mater.* 16 (1) (2004) 73-76; (b) T. Qiu, X. L. Wu, X. Yang, G. S. Huang, and Z. Y. Zhang, *App. Phys. Lett.,* 84 (19) (2004) 3867; (c) H. Fang, Y. Wu, J. Zhao, and J. Zhu, *Nanotechnology* 17 (2006) 3768 and Y. Yang, P. Chu, Z. Wu, S. Pu, T. Hung, K. Huo, G. Qian, W. Zhang, X. Wu, *Appl. Surf Sci.* 254 (2008) 3061 and X. Li and P. Bohn, *Appl. Phys. Lett.* 77 (16) (2000) 2572 and H. Asoh, F. Arai, S. Ono, *Electrochem. Comm.* 9 (2007) 535; (d) K. Peng, J. Hu, Y. Yan, Y. Wu, H. Fang, Y. Xu, S. Lee, and J. Zhu *Adv. Mat.* 16 (2006) 387; (e) Z. Huang, H. Fang, J. Zhu, *Adv. Fun. Mat.* 19 (2007) pg. 744; (f) K. Peng, M. Zhang, A. Lu, N. Wong, R. Zhang, S. Lee, *App. Phys. Lett.* 90 (2007) 163123; (g) U.S. Provisional Patent Application No. 61/044,573, filed Apr. 14, 2008; (h) U.S. Provisional Patent Application No. 61/195,872, filed Oct. 9, 2008; (i) U.S. Patent Application Publication No. 2007/0278476, filed Feb. 27, 2007; (j) L. Tsakalakos, J. Balch, J. Fronheiser et al. *App. Phys. Lett.* 91 (23) (2007) 233117; (k) M. D. Kelzenberg, D. B. Turner-Evans, B. M. Kayes et al., *Nano Lett.* 8 (2) (2008) 710-714; (l) C. K. Chan, H. Peng, G. Liu, K. Mcllwrath, X. F. Zhang, R. A. Huggins, and Y. Cui, *Nature Nanotech.* 3 (2008) 31-35; (m) U.S. Published Patent Application No. 2007/0190542, filed Oct. 3, 2006; (n) A. Luque, A. Marti, *Phys. Rev. Lett.* 78 (26) (1997) 5014-5017; (o) Q. Shao, A. A. Balandin, *App. Phys. Lett.* 91 (2007) 163503; (p) Y. Cui et al., *App. Phys. Lett.* 78 (2001) 2214-2216; (q) Z. Huang, T. Shimizu, S. Senz, Z. Zhang, X. Zhang, W. Lee, N. Geyer, and U. Gosele, *Nano Letters* 9 (7) (2009) 2519-2525; (r) U.S. Published Patent Application No. 2006/0207647; (s) H. W. Shim, J. D. Kuppers, and H. Huang, *Nanotechnology* 20 (2009) 025704; (t) C. Gao et al., *Microelectronic Engineering* 87 no. 5-8, (2010) pp. 927-930; (u) U.S. Published Patent Application No. 2010/0233585, filed Dec. 20, 2006; (v) EG&G Technical Services, Inc., *Fuel Cell Handbook* (7th ed. 2004); (w) Masaki Yoshio, R. J. Brodd, Akiya Kozawa, *Lithium-ion batteries: science and technologies* (Springer 2009).

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A process for etching a silicon-containing substrate, comprising the steps of (a) cleaning a surface of the substrate, (b) depositing a film on the cleaned substrate surface, (c) depositing a silver film on the film deposited in step (b), and (d) contacting the silver with an etchant comprising HF, wherein the film deposited in step (b) can be etched by an etchant comprising HF, and wherein the silver film deposited in step (c) is substantially uniform, wherein the etching of step (d) is silver-assisted; wherein the film described in step (b) comprises alumina.

2. The process of claim 1, wherein the film deposited in (c) is patterned.

3. The process of claim 1, further comprising step (a') of depositing nanoparticles atop the cleaned surface of the substrate.

4. The process of claim 1, further comprising step (a") of growing or depositing a layer of silicon dioxide atop the cleaned surface of the substrate.

5. The process of claim 1, wherein the alumina film has a thickness between about 20 nm and about 250 nm.

6. The process of claim 1, wherein the silver film has a thickness between about 10 nm and about 250 nm.

7. The process of claim 1, wherein the etchant further comprises an oxidizer.

8. The process of claim 1, wherein the oxidizer comprises bubbles of oxygen.

9. The process of claim 1, wherein the etchant is aqueous.

10. The process of claim 3, wherein the nanoparticles comprise polystyrene.

11. The process of claim 3, wherein the majority of the nanoparticles have diameters between about 20 nm and about 250 nm.

12. The process of claim 1, wherein a density of no more than 20 unintended nanowires per $\mu m^2$ is obtained as a result of etching.

13. The process of claim 3, further comprising a step of reducing the diameters of the deposited nanoparticles.

14. The process of claim 3, wherein the thickness of the silver film deposited in step (c) has a standard deviation of no more than about 25%.

* * * * *